(12) United States Patent
Tsuboi

(10) Patent No.: US 12,119,410 B2
(45) Date of Patent: Oct. 15, 2024

(54) DISPLAY DEVICE AND ELECTRONIC DEVICE

(71) Applicant: CANON KABUSHIKI KAISHA, Tokyo (JP)

(72) Inventor: Hiromasa Tsuboi, Tama (JP)

(73) Assignee: Canon Kabushiki Kaisha, Tokyo (JP)

( * ) Notice: Subject to any disclaimer, the term of this patent is extended or adjusted under 35 U.S.C. 154(b) by 483 days.

(21) Appl. No.: 16/599,296

(22) Filed: Oct. 11, 2019

(65) Prior Publication Data

US 2020/0126481 A1 Apr. 23, 2020

(30) Foreign Application Priority Data

Oct. 19, 2018 (JP) ................. 2018-197846

(51) Int. Cl.
*H01L 29/786* (2006.01)
*G09G 3/3233* (2016.01)
(Continued)

(52) U.S. Cl.
CPC ..... *H01L 29/78696* (2013.01); *G09G 3/3233* (2013.01); *H01L 27/1222* (2013.01); *H10K 59/1213* (2023.02); *G09G 2300/0426* (2013.01); *G09G 2300/0819* (2013.01); *G09G 2300/0852* (2013.01); *G09G 2300/0861* (2013.01); *G09G 2320/0238* (2013.01); *H10B 20/30* (2023.02); *H10K 59/12* (2023.02)

(58) Field of Classification Search
CPC ........... H01L 27/3262; H01L 29/78696; H01L 27/1222; H01L 27/3244; H01L 27/1122; G09G 3/3233; G09G 2300/0426; G09G 2300/0861; G09G 2300/0819; G09G 2300/0852; G09G 2320/0238
See application file for complete search history.

(56) References Cited

U.S. PATENT DOCUMENTS 4,978,626 A 12/1990 Poon
9,792,860 B2 10/2017 Hokazono
(Continued)

FOREIGN PATENT DOCUMENTS

JP S64-042854 A 2/1989
JP H02-284463 A 11/1990
(Continued)

OTHER PUBLICATIONS

Jun. 24, 2022 Office Action in Japanese Patent Application No. 2018-197846.
(Continued)

*Primary Examiner* — Shaheda A Abdin
(74) *Attorney, Agent, or Firm* — Venable LLP

(57) ABSTRACT

A display device in which a plurality of pixels are arranged in an array is provided. Each of the plurality of pixels comprises a current path that includes a light emitting element and a first transistor, and a second transistor for transmitting a luminance signal. The first transistor comprises diffusion regions arranged in the current path, and a gate electrode to which the luminance signal is transmitted from the second transistor. The diffusion regions are of a first conductivity type, and the gate electrode is of a second conductivity type opposite to the first conductivity type.

20 Claims, 9 Drawing Sheets

(51) Int. Cl.
  *H01L 27/12*    (2006.01)
  *H10K 59/121*   (2023.01)
  *H10B 20/00*    (2023.01)
  *H10K 59/12*    (2023.01)

(56) References Cited

U.S. PATENT DOCUMENTS

| | | | |
|---|---|---|---|
| 10,056,028 B2 | 8/2018 | Yamamoto | |
| 2004/0012545 A1* | 1/2004 | Li | G09G 3/3233 |
| | | | 345/55 |
| 2004/0087066 A1* | 5/2004 | Voutsas | H01L 51/0097 |
| | | | 257/E29.151 |
| 2006/0221662 A1* | 10/2006 | Park | G09G 3/3233 |
| | | | 365/145 |
| 2007/0161142 A1 | 7/2007 | Mouli et al. | |
| 2011/0084337 A1* | 4/2011 | Yamazaki | H01L 27/124 |
| | | | 257/E27.111 |
| 2012/0019498 A1* | 1/2012 | Jeong | G09G 3/3233 |
| | | | 345/76 |
| 2014/0132175 A1* | 5/2014 | Hokazono | H10K 59/1213 |
| | | | 315/240 |
| 2015/0077615 A1 | 3/2015 | Yamazaki et al. | |
| 2015/0138253 A1* | 5/2015 | Kimura | G09G 3/3283 |
| | | | 345/77 |
| 2017/0140700 A1 | 5/2017 | Yamamoto | |
| 2018/0261155 A1 | 9/2018 | Ota | |
| 2018/0342207 A1* | 11/2018 | Tsuboi | G09G 3/3233 |
| 2019/0355311 A1 | 11/2019 | Ota et al. | |

FOREIGN PATENT DOCUMENTS

| | | |
|---|---|---|
| JP | H07-321220 A | 12/1995 |
| JP | 2003-008007 A | 1/2003 |
| JP | 2004-079705 A | 3/2004 |
| JP | 2006-032681 A | 2/2006 |
| JP | 2008-034829 A | 2/2008 |
| JP | 2009-522813 A | 6/2009 |
| JP | 2010-145579 A | 7/2010 |
| JP | 2014-098779 A | 5/2014 |
| JP | 2015-084092 A | 4/2015 |
| JP | 2015-096906 A | 5/2015 |
| JP | 2017-090751 A | 5/2017 |
| JP | 2018-151506 A | 9/2018 |
| WO | 2018020844 A1 | 2/2018 |

OTHER PUBLICATIONS

Jul. 7, 2023 Japanese Official Action in Japanese Patent Appln. No. 2022-148890.

* cited by examiner

DISPLAY DEVICE AND ELECTRONIC DEVICE

BACKGROUND OF THE INVENTION

Field of the Invention

The present invention relates to a display device and an electronic device.

Description of the Related Art

There is known a display device in which pixels including light emitting elements such as organic EL (electroluminescence) elements which emit light at a luminance corresponding to a current flowing through the elements are arranged in an array. Japanese Patent Laid-Open No. 2010-145579 describes a pixel that includes a driving transistor for supplying a current corresponding to an image signal to a light emitting element.

SUMMARY OF THE INVENTION

In order to realize high contrast in a display device, a deep black display is required in a state where a light emitting element does not emit light. In order to perform a black display, it is necessary to suppress a leakage current of a driving transistor when the transistor is turned off.

Some embodiments of the present invention provide techniques that are advantageous for displaying black in a display device.

According to some embodiments, a display device in which a plurality of pixels are arranged in an array, wherein each of the plurality of pixels comprises a current path that includes a light emitting element and a first transistor, and a second transistor for transmitting a luminance signal, the first transistor comprises diffusion regions arranged in the current path, and a gate electrode to which the luminance signal is transmitted from the second transistor, the diffusion regions are of a first conductivity type, and the gate electrode is of a second conductivity type opposite to the first conductivity type, is provided.

Further features of the present invention will become apparent from the following description of exemplary embodiments (with reference to the attached drawings).

DESCRIPTION OF THE EMBODIMENTS

Figure 1:
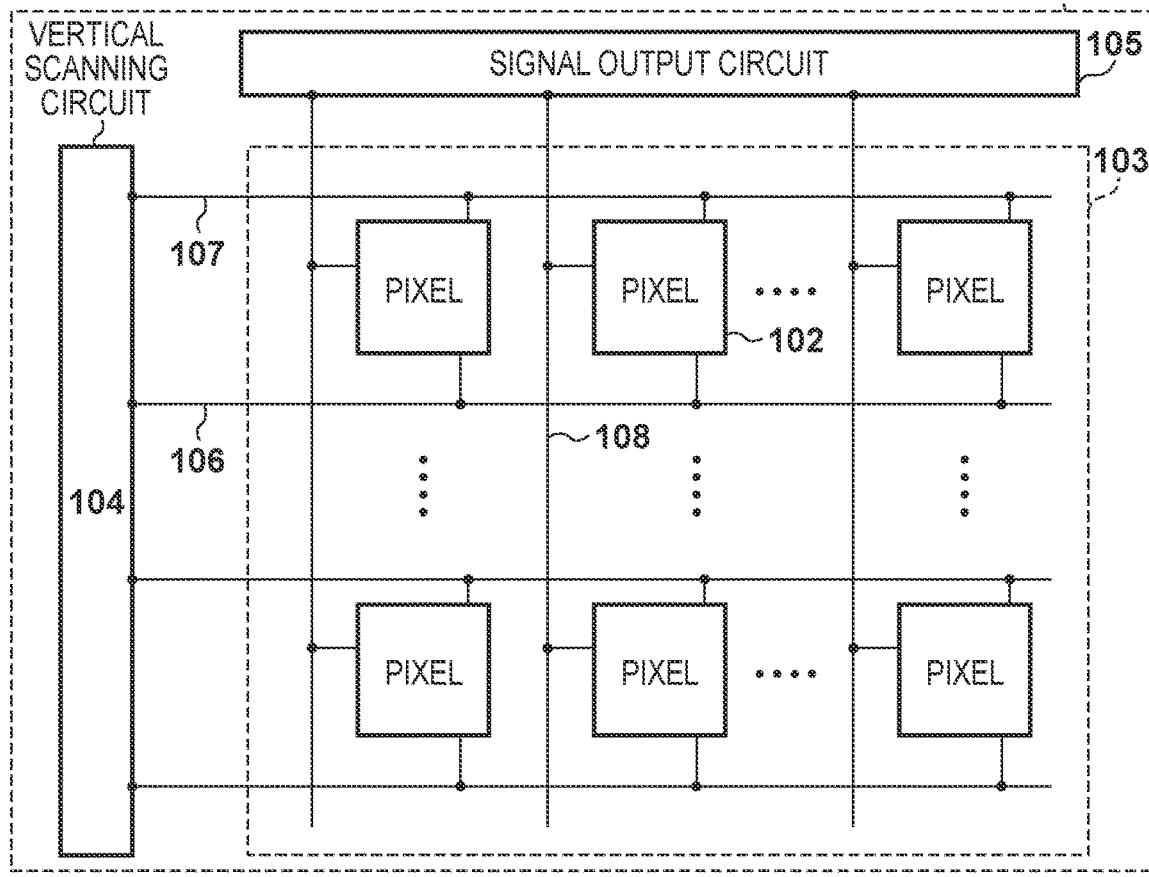
FIG. 1 is a diagram illustrating an example of a configuration of a display device according to an embodiment of the present invention.

Hereinafter, specific embodiments of a display device according to the present invention will be described with reference to the accompanying drawings. In the following description and the drawings, the same reference numerals are given for the same components throughout the plurality of drawings. Therefore, a common configuration will be described with reference to a plurality of drawings, and a description of a configuration to which a common symbol is assigned will be omitted as appropriate.

First Embodiment

Figure 2:
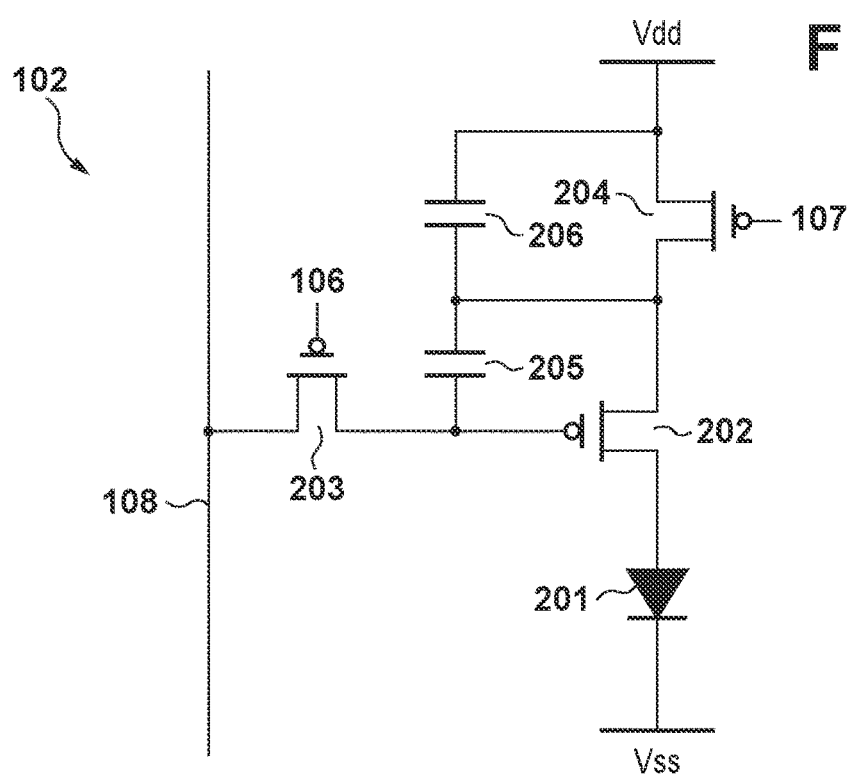
FIG. 2 is a circuit diagram illustrating an example of the configuration of a pixel of the display device of FIG. 1.

Referring to FIGS. 1 to 4, a configuration of a display device according to an embodiment of the present invention will be described. FIG. 1 is a diagram illustrating an example of a configuration of a display device 101 according to a first embodiment of the present invention, and FIG. 2 is a circuit diagram of a pixel 102 arranged in the display device 101.

Description is given below regarding a case where a driving transistor 202 is connected to an anode of a light emitting element 201 arranged in each pixel 102 of the display device 101, and all the transistors arranged in the pixel 102 are P-type transistors. However, the structure of the pixel 102 of the display device 101 is not limited to this. For example, the polarities and conductivity types of the respective transistors or the like may all be reversed. Further, for example, a driving transistor may be a P-type transistor, and other transistors may be an N-type transistor. A connection or a potential that is supplied may be changed as appropriate in accordance with the conductivity type or polarity of a light emitting element or a transistor included in the pixel 102 of the display device 101.

In the present embodiment, as illustrated in FIG. 1, the display device 101 includes a pixel array portion 103 and a driving portion arranged around the pixel array portion 103. The pixel array portion 103 includes a plurality of pixels 102 arranged in an array. Each pixel 102 comprises a light emitting element 201. The light emitting element 201 is provided with an anode and a cathode, and has an organic layer that includes a light-emitting layer between the anode and the cathode. The organic layer may have, as appropriate, one or more of a hole injection layer, a hole transport layer, an electron injection layer, and an electron transport layer in addition to the light emitting layer.

The driving portion is a circuit for driving the pixels 102 arranged in the pixel array portion 103. The driving portion includes, for example, a vertical scanning circuit 104 and a signal output circuit 105. In addition, in order to supply a signal from the driving portion to the pixels 102, in the pixel array portion 103, scanning lines 106 and 107 extending along the row direction (horizontal direction in FIG. 1) are arranged for each pixel row of the pixels 102 arranged in an array. In the pixel array portion 103, a signal line 108 extending along the column direction (vertical direction in FIG. 1) is arranged for each pixel column of the pixels 102 that are arranged in an array.

The scanning lines 106 and the scanning lines 107 are connected to respective pixel row output terminals of the vertical scanning circuit 104. The signal lines 108 are connected to respectively corresponding pixel column output terminals of the signal output circuit 105.

At the time of writing an image signal to each pixel 102 of the pixel array portion 103, the vertical scanning circuit 104 supplies a writing control signal to the corresponding scanning line 106. Further, a light emission control signal for driving the pixel 102 to cause it to emit light is supplied to the scanning line 107.

The signal output circuit 105 appropriately selects one of a luminance signal having a voltage corresponding to luminance information for a time of causing the light emitting element 201 of each pixel 102 to emit light, and a reference voltage signal having a reference voltage, and outputs the selected signal to the signal line 108. The luminance signal represents luminance in each pixel 102 of an image displayed on the display device 101, and may also be referred to as an image signal.

The pixel 102 of the present embodiment illustrated in FIG. 2 is provided with a current path that includes the light emitting element 201 and the driving transistor 202 (a first transistor), and a writing transistor 203 (a second transistor). The pixel 102 is further provided with a light emission control transistor 204 (third transistor) arranged in a current path that includes the light emitting element 201 and the driving transistor 202. The pixel 102 includes a capacitor element 205 and a capacitor element 206. Here, the total number of transistors and capacitor elements and the combination of conductivity types of the transistors are merely an example and there is no limitation to this structure. In the following description, when expressing that a transistor is connected between an element A and an element B, one main terminal of the transistor (source region or drain region) is connected to the element A, and the other main terminal of the transistor is connected to the element B. That is, when expressing that a transistor is connected between the element A and the element B, a case where the control terminal (gate electrode) of the transistor is connected to the element A, one main terminal is not connected to the element A, and the other main terminal is not connected to the element B is not included.

Next, a specific circuit configuration of the pixel 102 will be described with reference to FIG. 2. In the present embodiment, one end of a current path including the light emitting element 201, the driving transistor 202, and the light emission control transistor 204 is connected to the power supply potential Vss, and the other end is connected to the power supply potential Vdd. More specifically, the cathode of the light emitting element 201 is connected to the power supply potential Vss, and one of the main terminals of the light emission control transistor 204 (the source region in the configuration of FIG. 2) is connected to the power supply potential Vdd. However, there is no limitation to this, and other elements may be arranged between the power supply potential Vss and the light emitting element 201 or between the power supply potential Vdd and the light emission control transistor 204. Other elements may be provided between the light emitting element 201 and the driving transistor 202 or between the driving transistor 202 and the light emission control transistor 204. In the configuration illustrated in FIG. 2, the driving transistor 202 is arranged between the light emitting element 201 and the light emission control transistor 204, but the light emission control transistor 204 may be arranged between the light emitting element 201 and the driving transistor 202.

One of the main terminals of the driving transistor 202 (the drain region in the configuration of FIG. 2) is connected to the anode of the light emitting element 201. The control terminal (gate electrode) of the driving transistor 202 is connected to one of the main terminals (the drain region in the configuration of FIG. 2) of the writing transistor 203. The driving transistor 202 supplies a current corresponding to a luminance signal to the light emitting element 201 to drive the light emitting element 201.

The light emission control transistor 204 is arranged between the power supply potential Vdd for supplying a drive current to the driving transistor 202 and the driving transistor 202. More specifically, as described above, one main terminal of the light emission control transistor 204 (the source region in the configuration of FIG. 2) is connected to the power supply potential Vdd. The other main terminal of the light emission control transistor 204 (the drain region in the configuration of FIG. 2) is connected to the other main terminal of the driving transistor 202 (the source region in the configuration of FIG. 2). In addition, the control terminal of the light emission control transistor 204 is connected to the scanning line 107. In the structure illustrated in FIG. 2, the power supply potential Vdd is higher than the power supply potential Vss.

The writing transistor 203 is arranged between the signal line 108 and the control terminal of the driving transistor 202. More specifically, one main terminal of the writing transistor 203 is connected to the control terminal of the driving transistor 202 as described above, and the other main terminal of the writing transistor 203 is connected to the signal line 108. In addition, the control terminal of the writing transistor 203 is connected to the scanning line 106.

The capacitor element 205 is connected between the main terminal to which the light emission control transistor 204 of the driving transistor 202 is connected and the control terminal of the driving transistor 202. The capacitor element 206 is connected between the main terminal to which the light emission control transistor 204 of the driving transistor 202 is connected and the power supply potential Vdd.

The driving transistor 202 supplies a current from the power supply potential Vdd to the light emitting element 201 via the light emission control transistor 204, and causes the light emitting element 201 to emit light. More specifically, the driving transistor 202 supplies a current corresponding to the signal voltage of the image signal held in the capacitor element 205 to the light emitting element 201. By this, the light emitting element 201 emits light by current driving.

The writing transistor 203 enters a conductive state in response to a writing control signal applied from the vertical scanning circuit 104 to the control terminal via the scanning line 106. By this, the writing transistor 203 samples the signal voltage or the reference voltage of the luminance signal according to the luminance information supplied from the signal output circuit 105 via the signal line 108, and writes a result of the sampling to the pixel 102. The written signal voltage or reference voltage is applied to the control terminal of the driving transistor 202 and is held in the capacitor element 205. That is, the writing transistor 203 is arranged to transmit a luminance signal for causing the light emitting element 201 to emit light at a luminance corresponding to the luminance information, and transmits the luminance signal to the control terminal (gate electrode) of the driving transistor 202.

The light emission control transistor 204 enters a conductive state in response to a light emission control signal applied from the vertical scanning circuit 104 to its control terminal via the scanning line 107, thereby allowing the supply of current from the power supply potential Vdd to the driving transistor 202. By this, as described above, the driving of the light emitting element 201 by the driving transistor 202 becomes possible. In other words, the light emission control transistor 204 functions as a switch element for controlling light emission/non-light emission of the light emitting element 201 by controlling the conductive state of the current path.

In this manner, a period in which the light emitting element 201 is in a non-light-emitting state (a non-light-emitting period) is provided in accordance with a switching operation of the light emission control transistor 204, and the ratio between a light-emitting period in which the light emitting element 201 emits light and a non-light-emitting period can be controlled (so-called duty control). By this duty control, it is possible to reduce blurring of an afterimage accompanying light emission by the light emitting element 201 of each pixel 102 over one frame period, and in particular, it is possible to make the image quality of a moving image be more advantageous. In the present embodiment, a case where the light emission control transistor 204 is arranged in the pixel 102 is illustrated, but, even when the light emission control transistor 204 is not arranged, the display device 101 operates, and an effect attributable to a feature provided by the driving transistor 202, which will be described later, can be obtained.

As the light emitting element 201, an organic EL (Organic Electroluminescent) element can be used. When the light emitting element 201 emits light, the amount of current flowing through the driving transistor 202 changes in accordance with the signal voltage applied from the signal line 108 to the control terminal of the driving transistor 202 via the writing transistor 203. As a result, the capacitance between the anode and the cathode of the light emitting element 201 is charged to a predetermined potential, and a current corresponding to the potential difference flows. By this, the light emitting element 201 emits light at a predetermined luminance.

Figure 3:
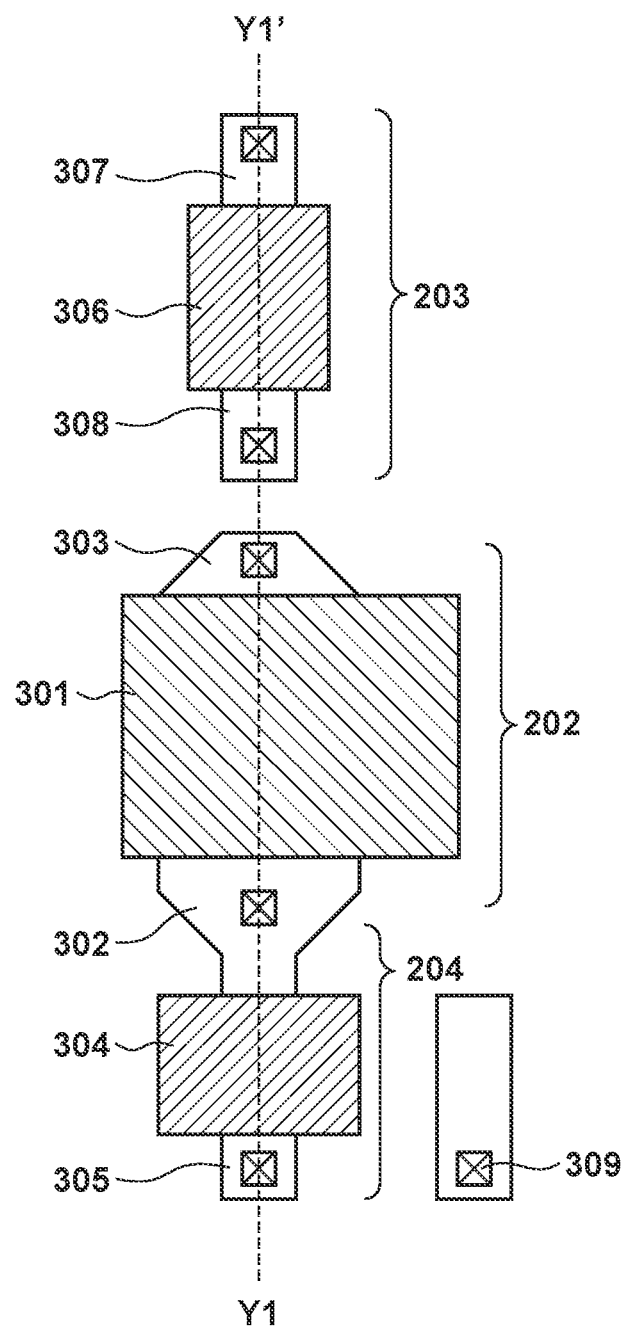
FIG. 3 is a plan view illustrating an example of the configuration of a pixel of the display device of FIG. 1.
Figure 4:
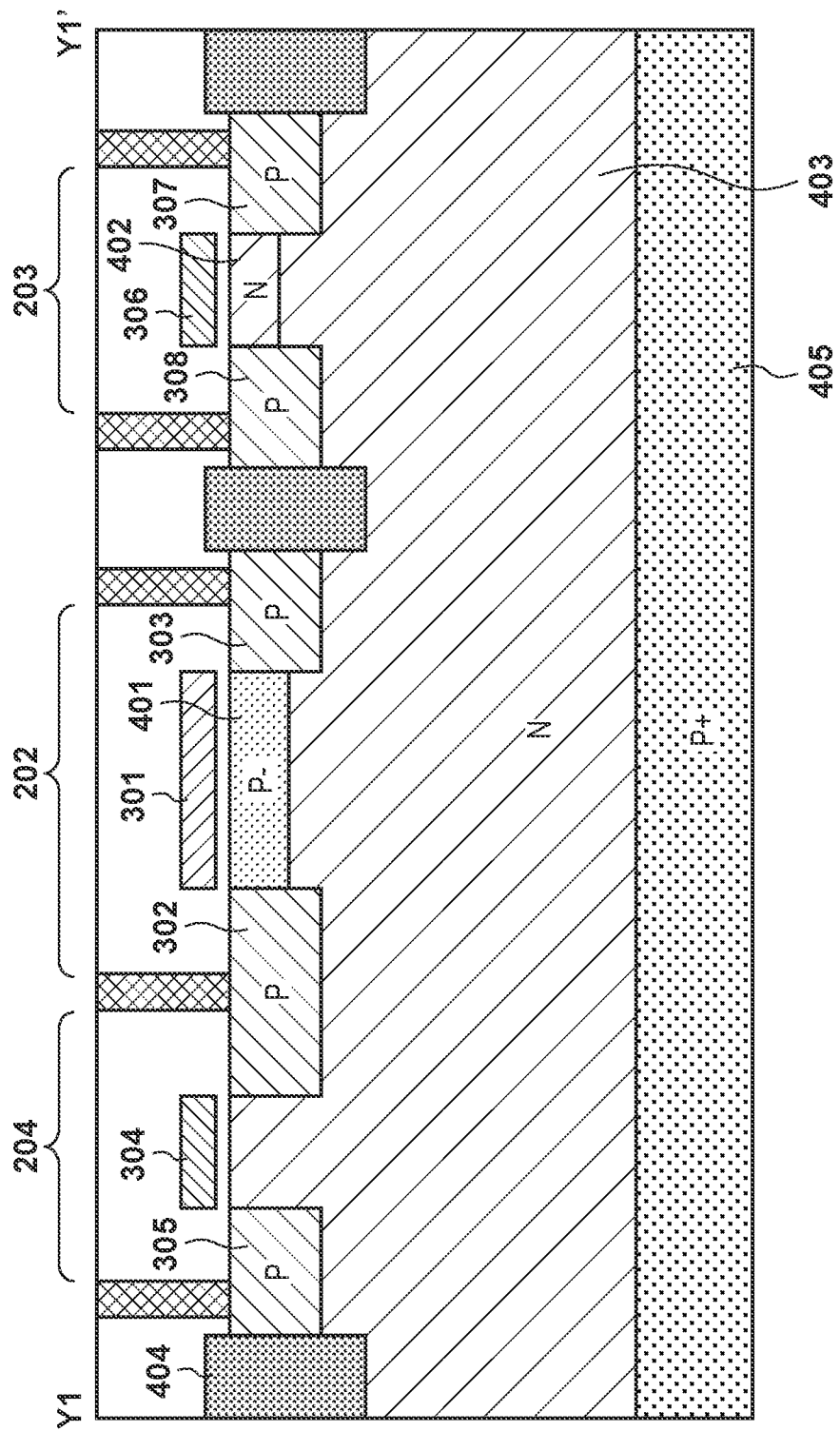
FIG. 4 is a cross-sectional view illustrating an example of the configuration of a pixel of the display device of FIG. 1.

Next, the writing transistor 203, the driving transistor 202, and the light emission control transistor 204 included in the pixel 102 will be described in detail with reference to FIGS. 3 and 4. FIG. 3 is a plan view of the pixel 102, and FIG. 4 is a cross-sectional view between the Y1-Y1' illustrated in FIG. 3.

The driving transistor 202 is provided with two diffusion regions 302 and 303 arranged in the current path that includes the light emitting element 201, the driving transistor 202, and the light emission control transistor 204. The two diffusion regions 302 and 303 each function as a main terminal (a source region or a drain region). The driving transistor 202 is provided with a gate electrode 301 that functions as a control terminal. As described above, the luminance signal is transmitted from the writing transistor 203 to the gate electrode 301. The gate electrode 301 is connected to one of the two terminals of the capacitor element 205, and the diffusion region 302 is connected to the other terminal of the capacitor element 205. The diffusion region 303 is connected to the anode of the light emitting element 201. In the present embodiment, the gate electrode 301 of the driving transistor 202, which is a P-type transistor, is of an N-type (second conductivity type), and is of a conductivity type that is opposite in polarity to the P-type diffusion regions 302 and 303. As a result, it is possible to increase the threshold voltage of the driving transistor 202, and suppress leakage current in the driving transistor 202 when the transistor is turned off. By suppressing the leakage current in the driving transistor 202 when the transistor is turned off, light emission of the light emitting element 201 in a non-light-emitting period is suppressed, and a deeper black display is realized. As a result, high contrast is obtained in the display device 101.

The light emission control transistor 204 is configured from a P-type gate electrode 304 functioning as a control terminal, and P-type diffusion regions 305 and 302 functioning as a main terminal (a source region or a drain region) respectively. In the present embodiment, the diffusion region 302 is shared with the driving transistor 202. However, there is no limitation to this, and the diffusion regions of the driving transistor 202 and the light emission control transistor 204 may be independent of each other. The diffusion region 305 is connected to the power supply potential Vdd and one terminal of the capacitor element 206, and the diffusion region 302 is connected to the other terminal of the capacitor element 206. The gate electrode 304 is connected to the scanning line 107.

The writing transistor 203 is configured from a P-type gate electrode 306 functioning as a control terminal, and P-type diffusion regions 307 and 308 functioning as a main terminal (a source region or a drain region) respectively. The diffusion region 308 is connected to the gate electrode 301 which is the control terminal of the driving transistor 202. The diffusion region 307 is connected to the signal line 108, and the gate electrode 306 is connected to the scanning line 106.

In the present embodiment, the writing transistor 203, the driving transistor 202, and the light emission control transistor 204 are arranged in an N-type well 403 provided in a P-type substrate 405. The well contact portion 309 applies the power supply potential Vdd to the N-type well 403. For the element isolation portion 404, STI (Shallow Trench Isolation) isolation, LOCOS (Local Oxidation Of Silicon) isolation, N-type diffusion layer isolation, or the like may be used as appropriate.

In the present embodiment, an N-type conductivity type is provided for only the gate electrode 301 of the driving transistor 202 among the writing transistor 203, the driving transistor 202, and the light emission control transistor 204 arranged in the pixel 102, and the other gate electrodes 304 and 306 are of a P-type conductivity type. However, when the N-type gate electrode is formed in the circuit of the driving portion arranged around the pixel array portion 103, the gate electrode 301 is also formed at the same time, so that the number of steps when manufacturing the display device 101 does not need to be increased.

Further, the inventor has proceeded with a study of the display device 101 having the above-described configuration, and has noticed the following problems. In a step of forming a channel portion of the driving transistor 202, variation occurs in the amount of impurity ions implanted, resulting in variation in the channel concentration and mobility of the driving transistor 202. As a result, the amount of current supplied to the light emitting element 201 by the driving transistor 202 varies, resulting in display unevenness.

In order to solve this problem, the channel region 401 of the driving transistor 202 may be a P-type diffusion layer or an N-type diffusion layer, but the impurity concentration is set low within a possible range. As a result, variation in the channel concentration and mobility of the driving transistor 202 is suppressed, and variation in the amount of current supplied to the light emitting element 201 in a light-emitting period is reduced. The more that the impurity concentration of the channel region 401 of the driving transistor 202 approaches "0", the more that variation in the amount of current can be suppressed. For example, the impurity concentration of the channel region 401 of the driving transistor 202 may be lower than the impurity concentration of the well 403. For example, the impurity concentration of the channel region 401 of the driving transistor 202 may be lower than the impurity concentration of the N-type channel region 402 of the writing transistor 203.

As illustrated in FIG. 4, the channel region 401 of the driving transistor 202 may be a P-type buried channel. By making the channel region 401 be a P-type buried channel, fluctuation in current due to RTS (Random Telegraph Signal) noise of the driving transistor 202 can be suppressed. Even in this case, the impurity concentration of the channel region 401 of the driving transistor 202 may be lower than the impurity concentration of the well 403. For example, the impurity concentration of the channel region 401 of the driving transistor 202 may be lower than the impurity concentration of the channel region 402 of the writing transistor 203. In the present specification, the impurity concentration may be a concentration based on a number of carriers decided in accordance with the difference between the number of holes and electrons in each region that functions as P-type or N-type.

As described above, by using the N-type gate electrode 301 in the driving transistor 202 which is a P-type transistor, leakage current of the driving transistor 202 when the transistor is turned off is suppressed, and black display by the display device 101 can be made even blacker. In addition, by lowering the impurity concentration of the channel region 401 of the driving transistor 202, variation in the amount of current supplied to the light emitting element 201 is suppressed, and display unevenness of the display device 101 can be suppressed. Further, by setting the conductivity type of the channel region 401 of the driving transistor 202 to P-type, RTS noise can be reduced, so that variation in the amount of current supplied to the light emitting element 201 can be further suppressed. As a result, high-quality display can be realized in the display device 101.

Second Embodiment

Figure 5:
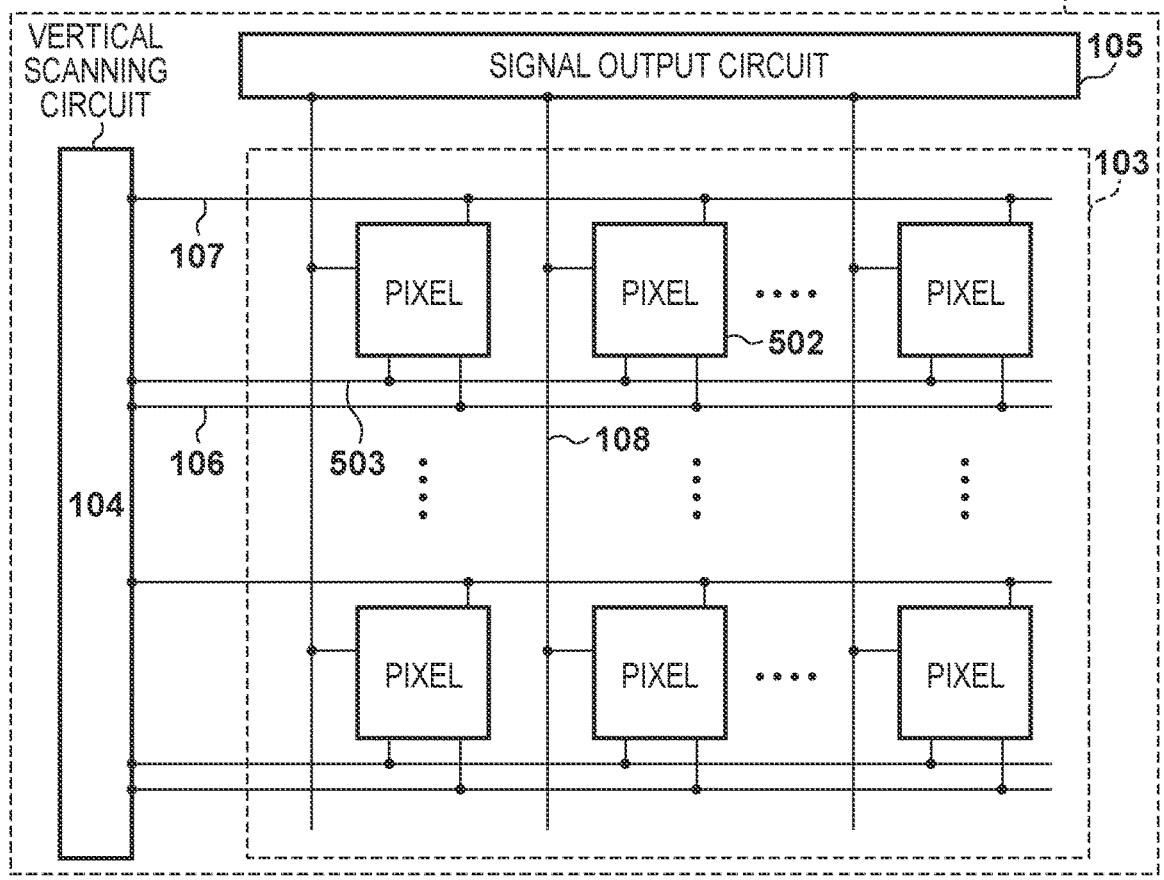
FIG. 5 is a diagram illustrating an example of a configuration of a display device according to an embodiment of the present invention.
Figure 6:
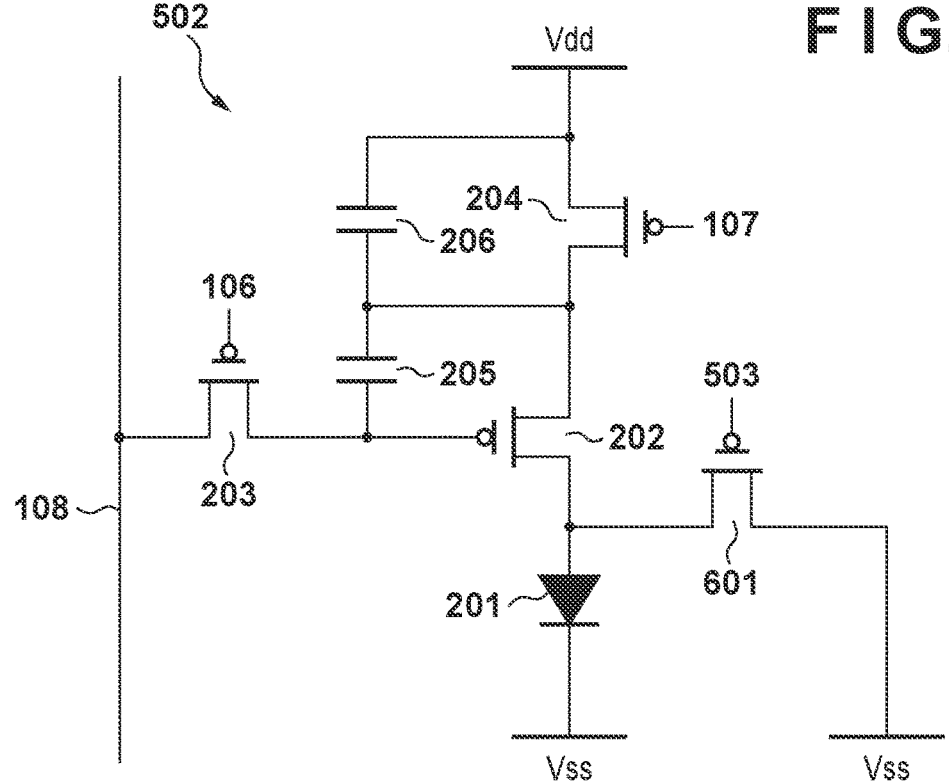
FIG. 6 is a circuit diagram illustrating an example of the configuration of a pixel of the display device of FIG. 5.

Referring to FIGS. 5 to 8, a configuration of a display device according to an embodiment of the present invention will be described. FIG. 5 is a diagram illustrating an example of a configuration of a display device 501 according to a second embodiment of the present invention, and FIG. 6 is a circuit diagram of a pixel 502 arranged in the display device 501. In the present embodiment, the pixel 502 of the display device 501 is provided with a reset transistor 601 (a fourth transistor) for connecting the anode of the light emitting element 201 to the power supply potential Vss. In addition, a scanning line 503 for switching between conduction and non-conduction of the reset transistor 601 is provided in the pixel array portion 103 of the display device 101. Other configurations may be similar to those of the display device 101 described above. Hereinafter, description is mainly given for differences in configuration of the display device 501 of the present embodiment with respect to that of the display device 101 described above.

As illustrated in FIG. 5, in the pixel array portion 103, a scanning line 503 extending along the row direction is arranged for each pixel row of the pixels 502 that are arranged in an array. The scanning lines 503 are connected to respectively corresponding pixel row output terminal of the vertical scanning circuit 104, and supply a reset signal to each pixel 502.

As illustrated by FIG. 6, one main terminal of the reset transistor 601 (a source region in the configuration of FIG. 6) is connected to the anode of the light emitting element 201 and one main terminal of the driving transistor 202 (a drain region in the configuration of FIG. 6). The other main terminal of the reset transistor 601 (the drain region in the configuration of FIG. 6) is connected to the power supply potential Vss. A control terminal (gate electrode) of the reset transistor 601 is connected to the scanning line 503. In the non-light-emitting period, by the reset transistor 601 entering the conductive state, the anode of the light emitting element 201 is connected to the power supply potential Vss 207, and the two terminals of the light emitting element 201 are short-circuited. By this, the light emitting element 201 can be brought into a non-light emitting state (a reset operation). By providing the reset transistor 601 in the pixel 502, it is possible to cause the light emitting element 201 to reliably have a black display in a non-light-emitting period, and realize the display device 501 having a high contrast ratio.

Figure 7:
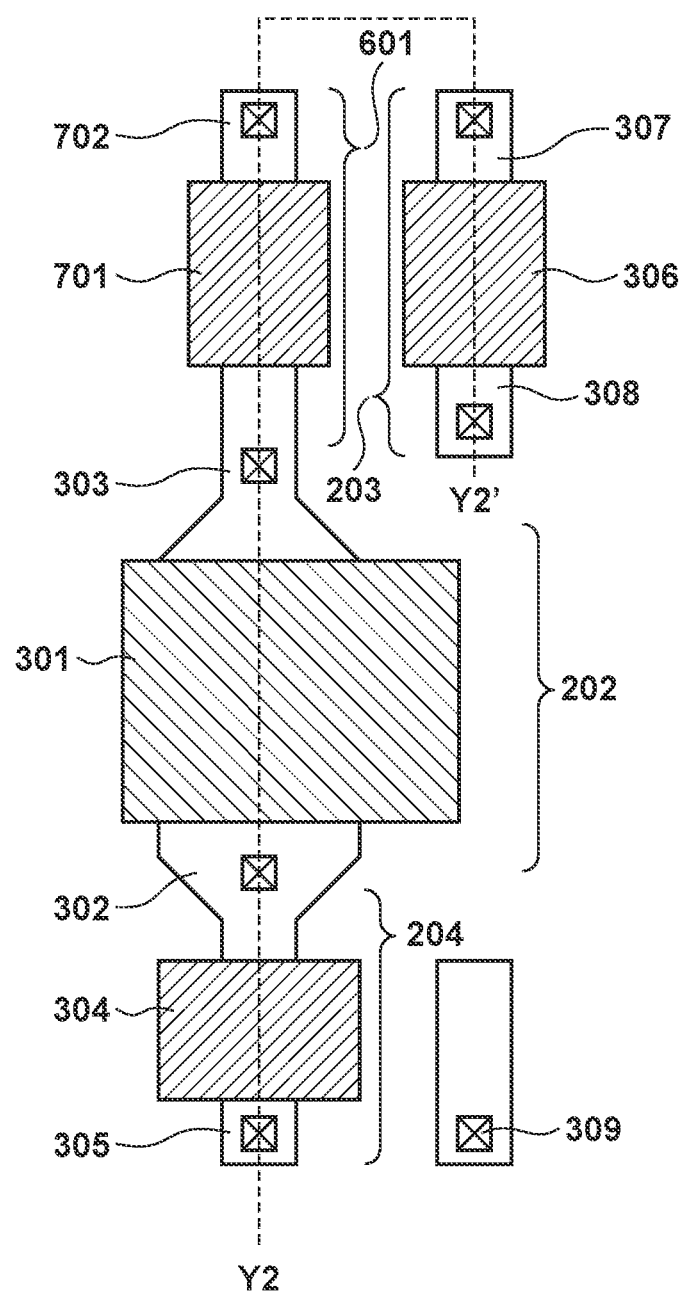
FIG. 7 is a plan view illustrating an example of the configuration of a pixel of the display device of FIG. 5.

Next, the reset transistor 601 will be described in detail with reference to FIGS. 7 and 8. FIG. 7 is a plan view of the pixel 502, and FIG. 8 is a cross-sectional view between the Y2-Y2' illustrated in FIG. 7.

Figure 8:
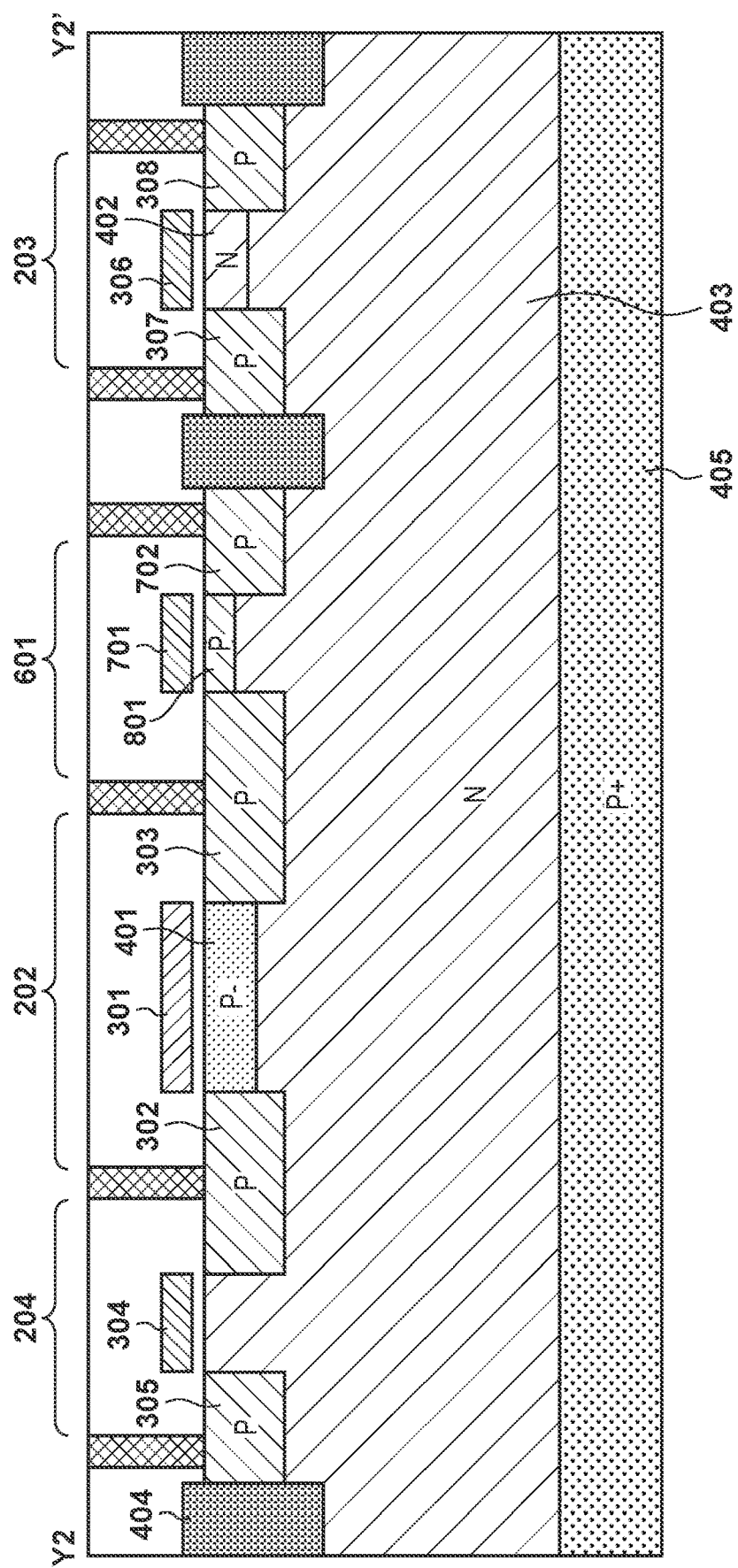
FIG. 8 is a cross-sectional view illustrating an example of the configuration of a pixel of the display device of FIG. 5.

As illustrated in FIGS. 7 and 8, the reset transistor 601 is configured by a P-type gate electrode 701 that functions as a control terminal, the P-type diffusion region 303 that functions as a main terminal, and a P-type diffusion region 702 that functions as a main terminal. In the present embodiment, the diffusion region 303 is shared with the driving transistor 202. However, there is no limitation to this, and the diffusion regions of the driving transistor 202 and the reset transistor 601 may be independent of each other.

As illustrated in FIG. 8, a channel region 801 of the reset transistor 601 may be a P-type diffusion layer. As a result, it is possible to reduce the threshold voltage of the reset transistor 601, and prevent the anode of the light emitting element 201 from attaining a potential higher than the power supply potential Vss at the time of a reset operation. On the other hand, as described above, the impurity concentration of the channel region 401 of the driving transistor 202 can be set to a low value. Therefore, the impurity concentration of the channel region 401 of the driving transistor 202 may be lower than the impurity concentration of the channel region 801 of the reset transistor 601. By providing the reset transistor 601 in the pixel 502, transition of the light emitting element 201 to the non-light-emitting state can be more reliably performed, and high-quality display with higher contrast can be realized in the display device 501.

Third Embodiment

Figure 9:
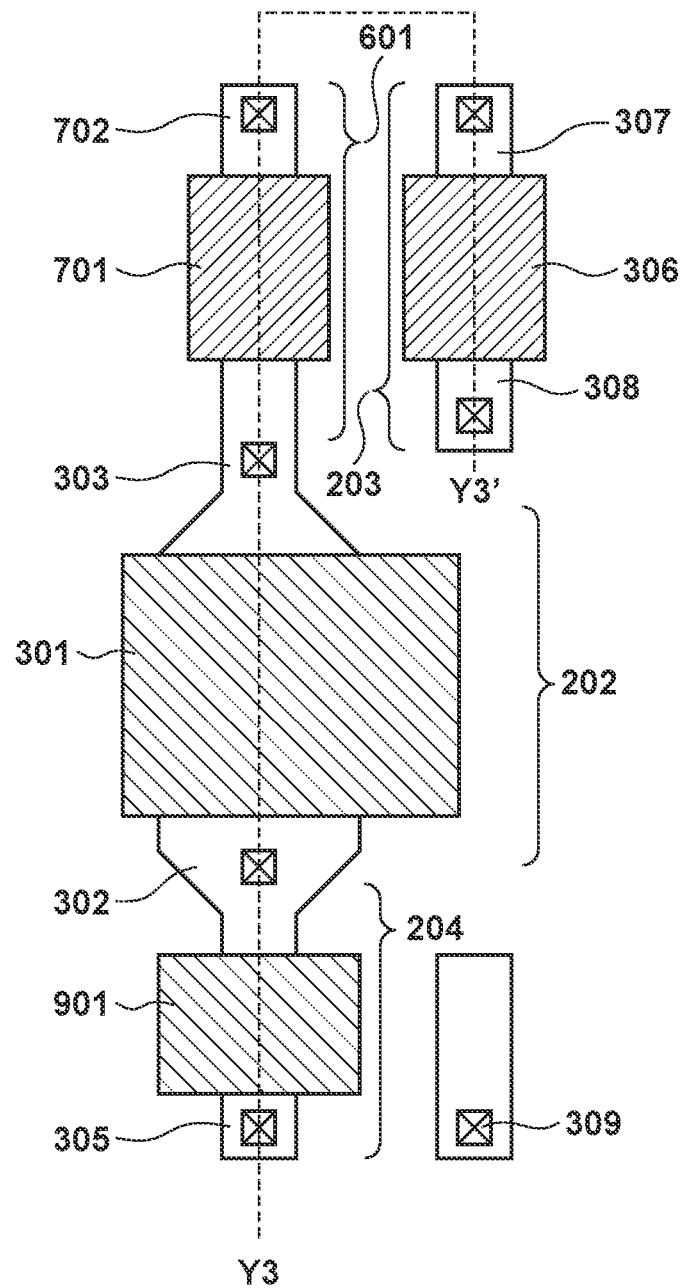
FIG. 9 is a plan view illustrating an example of the configuration of a pixel of the display device of FIG. 5.
Figure 10:
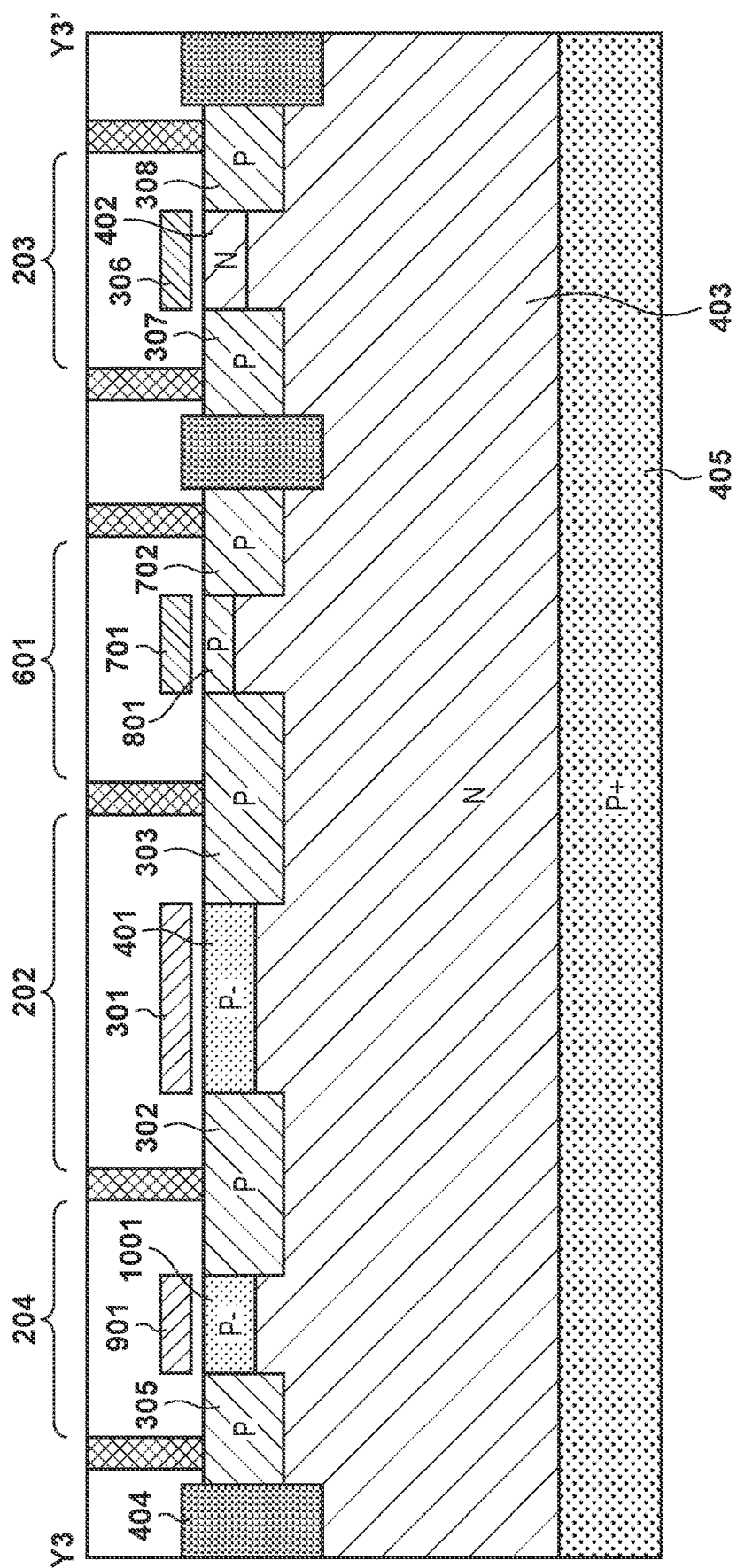
FIG. 10 is a cross-sectional view illustrating an example of the configuration of a pixel of the display device of FIG. 5.

Referring to FIGS. 9 and 10, a configuration of a display device according to an embodiment of the present invention will be described. FIG. 9 is a plan view of the pixel 502 of a display device 501 according to a third embodiment of the present invention, and FIG. 10 is a cross-sectional view between Y3-Y3' illustrated in FIG. 9. Compared to the second embodiment illustrated in FIGS. 7 and 8, the conductivity types of the gate electrode 901 and the channel region 1001 of the light emission control transistor 204 are different. Other configurations may be similar to those of the above-described display device 501, and a description thereof is omitted here.

In the configuration illustrated in FIG. 9, the gate electrode 901 of the light emission control transistor 204, which is a P-type transistor, is of an N-type, and is of a conductivity type that is opposite in polarity to the P-type diffusion regions 302 and 305. As a result, it is possible to increase the threshold voltage of the light emission control transistor 204, and suppress leakage current in the light emission control transistor 204 when the transistor is turned off. By this, in a non-light-emitting period, the signal voltage held by the capacitor element 205 can be prevented from fluctuating due to the leakage current of the light emission control transistor 204 when the transistor is turned off. As a result, high-quality display can be realized in the display device 101. At this time, the impurity concentration of the gate electrode 301 of the driving transistor 202 and the impurity concentration of the gate electrode 901 of the light emission control transistor 204 may be different from each other or may be the same. The impurity concentrations of the gate electrode 301 and the gate electrode 901 can be adjusted as appropriate within a range satisfying a specification of a product.

The channel region 1001 of the light emission control transistor 204 may be a P-type diffusion layer or an N-type diffusion layer, but the impurity concentration is set low within a possible range. As a result, variation in the channel concentration and mobility of the driving transistor 202 is suppressed, and variation in the amount of current supplied to the light emitting element 201 in a light-emitting period is reduced. Similarly to the impurity concentration of the channel region 401 of the driving transistor 202, the more that the impurity concentration of the channel region 1001 of the light emission control transistor 204 approaches "0", the more that variation in the amount of current can be suppressed. For example, the impurity concentration of the channel region 1001 of the light emission control transistor 204 may be lower than the impurity concentration of the well 403. For example, the impurity concentration of the channel region 1001 of the light emission control transistor 204 may be lower than the impurity concentration of the channel region 402 of the writing transistor 203. For example, the impurity concentration of the channel region 1001 of the light emission control transistor 204 may be lower than the impurity concentration of the channel region 801 of the reset transistor 601. For example, the impurity concentration of the channel region 1001 of the light emission control transistor 204 may be the same as or may be lower than the impurity concentration of the channel region 401 of the driving transistor 202.

As illustrated in FIG. 10, the channel region 1001 of the light emission control transistor 204 may be a P-type buried channel. By forming the channel region 1001 as a P-type buried channel, fluctuation of current due to RTS noise of the light emission control transistor 204 can be suppressed. In a light-emitting period in which the light emitting element 201 is caused to emit light, current flows from the power supply potential Vdd to the light emitting element 201 through both the light emission control transistor 204 and the driving transistor 202. Therefore, by suppressing fluctuation of the current of the light emission control transistor 204, display unevenness in the display device 501 can be suppressed. Even in this case, the impurity concentration of the channel region 1001 of the light emission control transistor 204 may be lower than the impurity concentrations of the well 403 and the channel regions 402 and 801. Similarly, the impurity concentration of the channel region 1001 of the light emission control transistor 204 may be the same as or may be lower than the impurity concentration of the channel region 401 of the driving transistor 202.

In the present embodiment, similarly to the above-described embodiments, the display device 501 having high contrast can be realized. In addition, by using the N-type gate electrode 901 in the light emission control transistor 204 which is a P-type transistor, it is possible to suppress the signal voltage held by the capacitor element 205, and also realize a high-quality display in the display device 501.

Although three embodiments according to the present invention have been described above, it goes without saying that the present invention is not limited to these embodiments, and the above-described embodiments can be appropriately modified and combined in a range that does not depart from the spirit of the present invention. For example, the writing transistor 203 and the light emission control transistor 204 may be configured by N-type transistors. In this case, the element isolation portion 404 can be arranged between the light emission control transistor 204 and the driving transistor 202. Further, for example, in the pixel 102 of the display device 101 illustrated in the first embodiment, the light emission control transistor 204 may have the structure illustrated in the third embodiment.

The display devices 101 and 501 as described above can be incorporated in various electronic devices. It is possible to give cameras, computers, portable terminals, in-vehicle display devices, and the like as examples of such electronic devices. An electronic device can include, for example, the display device 101 or 501, and a control unit that controls driving of the display devices 101 and 501.

Figure 11:
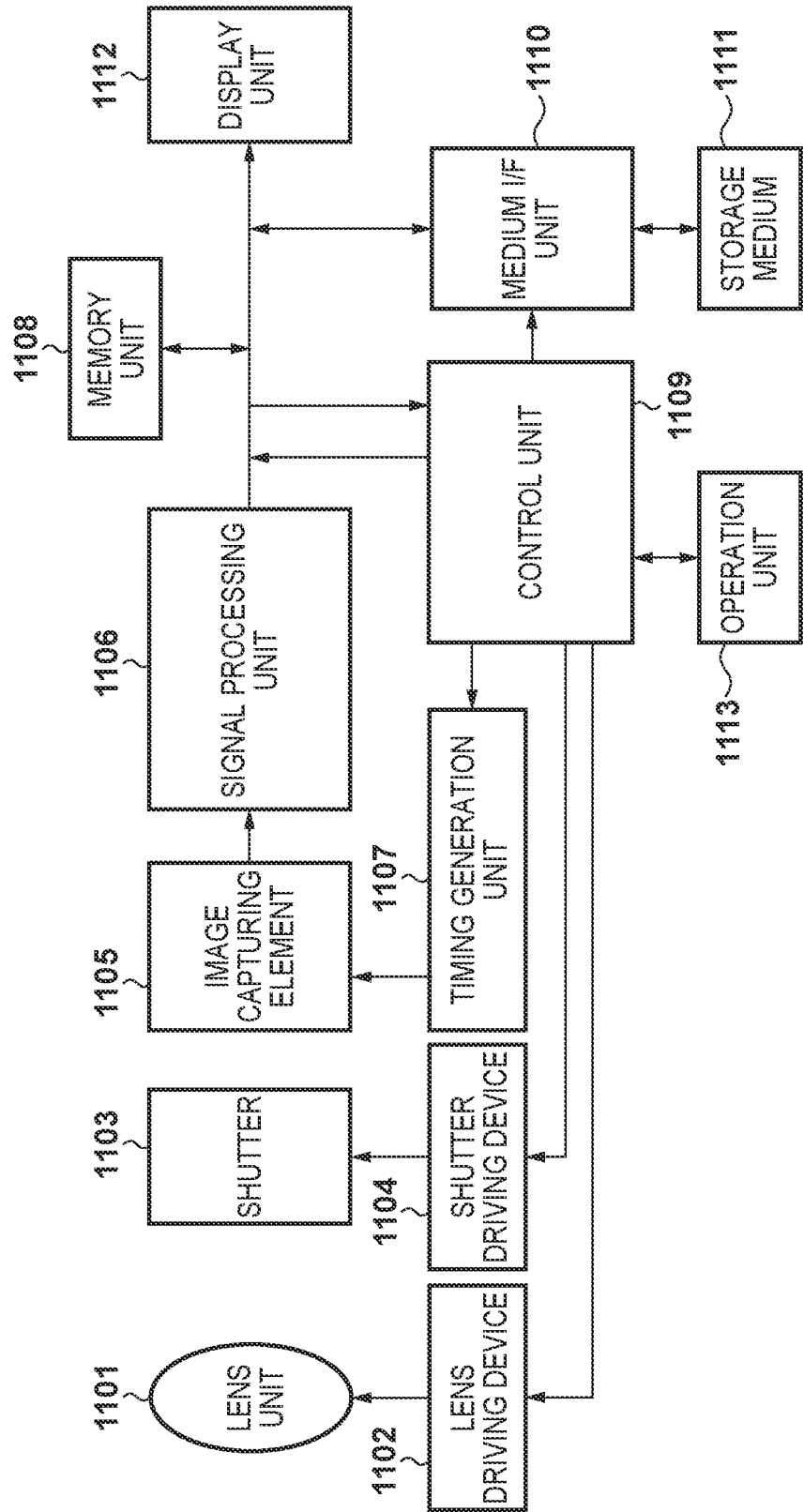
FIG. 11 is a block diagram illustrating an example of a configuration of a camera using the display devices of FIGS. 1 and 5.

Here, an embodiment in which the above-described display device 101 or 501 is applied to a display unit of a digital camera will be described with reference to FIG. 11. A lens unit 1101 is an image capturing optical system for forming an optical image of a subject on an image capturing element 1105, and has a focus lens, a variable magnification lens, a diaphragm, and the like. Driving of a focus lens position, a magnification lens position, an opening diameter of an aperture, and the like in the lens unit 1101 is controlled by a control unit 1109 through a lens driving device 1102.

A mechanical shutter 1103 is arranged between the lens unit 1101 and the image capturing element 1105, and the driving is controlled by the control unit 1109 through a shutter driving device 1104. The image capturing element 1105 converts an optical image formed by the lens unit 1101 by a plurality of pixels into an image signal. A signal processing unit 1106 performs A/D conversion, demosaic processing, white balance adjustment processing, encoding processing, and the like on the image signal which is outputted from the image capturing element 1105.

A timing generation unit 1107 outputs various timing signals to the image capturing element 1105 and the signal processing unit 1106. The control unit 1109 has, for example, a memory (ROM, RAM) and a microprocessor (CPU), and realizes various functions of the digital camera by loading a program stored in the ROM into the RAM and the CPU executing the program to control each unit. Functions realized by the control unit 1109 include automatic focus detection (AF) and automatic exposure control (AE).

A memory unit 1108 is used as a work region, and the control unit 1109 or the signal processing unit 1106 temporarily store image data in the memory unit 1108. A medium I/F unit 1110 is an interface for reading and writing from/to a storage medium 1111, which is a detachable memory card, for example. A display unit 1112 displays a captured image and various information of the digital camera. The display devices 101 and 501 described above can be applied to the display unit 1112. The display device 101 or 501 mounted on the digital camera as the display unit 1112 are driven by the control unit 1109 to display images and various information. The operation unit 1113 is a user interface such as a power switch, a release button, and a menu button for the user to make an instruction or a setting with respect to the digital camera.

Next, the operation of the digital camera at a time of capturing will be described. When the power is turned on, the camera enters a capture standby state. The control unit 1109 starts moving image capturing processing and display processing for causing the display unit 1112 (the display device 101 or 501) to operate as an electronic viewfinder. When an image capturing preparation instruction (for example, a half-press of a release button of the operation unit 1113) is inputted in the capture standby state, the control unit 1109 starts focus detection processing.

Then, the control unit 1109 obtains a movement amount and a movement direction of the focus lens of the lens unit 1101 from an obtained defocus amount and direction, drives the focus lens through the lens driving device 1102, and adjusts the focus of the imaging optical system. After the driving, the focus lens position may be finely adjusted by further performing focus detection based on a contrast evaluation value, as necessary.

Thereafter, when an image capturing start instruction (for example, a full press of the release button) is input, the control unit 1109 executes a capturing operation for storing, and the obtained image data is processed by the signal processing unit 1106 and stored in the memory unit 1108. Then, the control unit 1109 stores the image data stored in the memory unit 1108 into the storage medium 1111 through the medium control I/F unit 1110. At this time, the control unit 1109 may drive the display unit 1112 (display device 101 or 501) so as to display the captured image. The control unit 1109 may output image data from an external I/F unit (not illustrated) to an external device such as a computer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-197846, filed Oct. 19, 2018, which is hereby incorporated by reference herein in its entirety.

What is claimed is:

1. A display device comprising:
   a silicon substrate; and
   a plurality of pixels arranged in an array,
   wherein each of the plurality of pixels comprises: a current path that includes a light emitting element and a first transistor; a second transistor for transmitting a luminance signal; and a reset transistor for shorting between terminals of the light emitting element,
   wherein the first transistor comprises (1) diffusion regions arranged in the current path, (2) a channel region arranged between the diffusion regions, and (3) a gate electrode to which the luminance signal is transmitted from the second transistor,
   wherein the diffusion regions of the first transistor are of a first conductivity type,
   wherein the gate electrode of the first transistor is of a second conductivity type opposite to the first conductivity type,
   wherein the diffusion regions of the first transistor are provided in a well of the silicon substrate, the well having the second conductivity type,
   wherein diffusion regions of the reset transistor are of the first conductivity type,
   wherein a gate electrode of the reset transistor is of the first conductivity type,
   wherein the reset transistor is connected to an anode of the light emitting element,
   wherein the reset transistor is switchable between a conductive state and a non-conductive state, and
   wherein, by the reset transistor entering the conductive state, the terminals of the light emitting element are shorted and the light emitting element is in a non-light-emitting state.

2. The display device according to claim 1, wherein an impurity concentration of a channel region of the first transistor is lower than an impurity concentration of a channel region of the second transistor.

3. The display device according to claim 1, wherein a channel region of the first transistor is of the first conductivity type.

4. The display device according to claim 3, wherein an impurity of the diffusion regions is higher than an impurity of the channel region of the first transistor.

5. The display device according to claim 1, wherein the first transistor and the second transistor are arranged in the well, and
   wherein an impurity concentration of a channel region of the first transistor is lower than an impurity concentration of the well.

6. The display device according to claim 5, wherein each of the plurality of pixels further comprises a fourth transistor that is arranged in the current path, the fourth transistor being configured for controlling a conductive state of the current path,
   wherein diffusion regions of the fourth transistor are of the first conductivity type,
   wherein a gate electrode of the fourth transistor is of the second conductivity type, and
   wherein the impurity concentration of the channel region of the fourth transistor is lower than the impurity concentration of the well.

7. The display device according to claim 1, wherein each of the plurality of pixels further comprises a fourth transistor that is arranged in the current path, the fourth transistor being configured for controlling a conductive state of the current path.

8. The display device according to claim 7, wherein diffusion regions of the fourth transistor are of the first conductivity type, and
   wherein a gate electrode of the fourth transistor is of the second conductivity type.

9. The display device according to claim 7, wherein an impurity concentration of a channel region of the fourth transistor is lower than an impurity concentration of a channel region of the second transistor.

10. The display device according to claim 7, wherein a channel region of the fourth transistor is of the first conductivity type.

11. The display device according to claim 7, wherein an impurity concentration of the gate electrode of the first transistor and an impurity concentration of a gate electrode of the fourth transistor are different from each other.

12. The display device according to claim 7, wherein the first transistor is arranged between the light emitting element and the fourth transistor.

13. The display device according to claim 7, wherein an impurity concentration of a channel region of the fourth transistor is lower than an impurity concentration of a channel region of the reset transistor.

14. The display device according to claim 1, wherein an impurity concentration of a channel region of the first transistor is lower than an impurity concentration of a channel region of the reset transistor.

15. The display device according to claim 1, wherein a channel region of the reset transistor is of the first conductivity type.

16. The display device according to claim 1, wherein diffusion regions and a gate electrode of the second transistor are of the first conductivity type, and
   wherein a channel region of the second transistor is of the second conductivity type.

17. An electronic device comprising:
   the display device according to claim 1; and
   a control unit configured to control driving of the display device.

18. The display device according to claim 1, wherein the gate electrode of the first transistor is a semiconductor of a same conductivity type as the substrate.

19. The display device according to claim 1, wherein the substrate is composed of a semiconductor.

20. The display device according to claim 19, wherein an insulation layer is arranged between the channel region and the gate electrode, and
   wherein the insulation layer is composed of an oxide of the semiconductor.

* * * * *